United States Patent
Kim et al.

(10) Patent No.: US 10,942,449 B2
(45) Date of Patent: *Mar. 9, 2021

(54) PHOTOSENSITIVE RESIN COMPOSITION AND CURED FILM PREPARED THEREFROM

(71) Applicant: Rohm and Haas Electronic Materials Korea Ltd., Cheonan (KR)

(72) Inventors: Yeonok Kim, Hwaseong (KR); Geun Huh, Hwaseong (KR); Jong Han Yang, Hwaseong (KR); Jin Kwon, Hwaseong (KR); Jin Kyu Im, Hwaseong (KR)

(73) Assignee: Rohm and Haas Electronic Materials Korea Ltd., Seoul (KR)

(*) Notice: Subject to any disclaimer, the term of this patent is extended or adjusted under 35 U.S.C. 154(b) by 0 days.

This patent is subject to a terminal disclaimer.

(21) Appl. No.: 15/725,388

(22) Filed: Oct. 5, 2017

(65) Prior Publication Data

US 2018/0095365 A1 Apr. 5, 2018

(30) Foreign Application Priority Data

Oct. 5, 2016 (KR) .................. 10-2016-0128259
Sep. 14, 2017 (KR) .................. 10-2017-0117938

(51) Int. Cl.
| | | |
|---|---|---|
| *G03F 7/075* | (2006.01) | |
| *G03F 7/004* | (2006.01) | |
| *G03F 7/023* | (2006.01) | |
| *C08L 83/04* | (2006.01) | |
| *G03F 7/022* | (2006.01) | |
| *G03F 7/039* | (2006.01) | |
| *C08G 77/04* | (2006.01) | |

(52) U.S. Cl.
CPC ............ *G03F 7/0048* (2013.01); *C08L 83/04* (2013.01); *G03F 7/0226* (2013.01); *G03F 7/0233* (2013.01); *G03F 7/039* (2013.01); *G03F 7/0755* (2013.01); *G03F 7/0757* (2013.01); *C08G 77/04* (2013.01)

(58) Field of Classification Search
CPC ........ G03F 7/075; G03F 7/039; G03F 7/0048; C08L 83/04
See application file for complete search history.

(56) References Cited

U.S. PATENT DOCUMENTS

| | | | | |
|---|---|---|---|---|
| 5,853,947 A | * | 12/1998 | Wanat | G03F 7/0048 430/165 |
| 2009/0311622 A1 | * | 12/2009 | Sugita | G03F 7/0045 430/270.1 |
| 2010/0102321 A1 | * | 4/2010 | Abe | G03F 7/022 257/59 |
| 2011/0008589 A1 | * | 1/2011 | Kimura | C08G 77/045 428/195.1 |

FOREIGN PATENT DOCUMENTS

KR 20080065984 A 7/2008

* cited by examiner

*Primary Examiner* — Margaret G Moore
(74) *Attorney, Agent, or Firm* — S. Matthew Cairns

(57) ABSTRACT

The present invention relates to a photosensitive resin composition and to a cured film formed therefrom, wherein the photosensitive resin composition can improve the sensitivity by using an alcoholic solvent, along with a siloxane polymer and a quinone diazide compound conventionally used, which enhances the solubility in a developer through an interaction between the alcohol and the diazonaphthoquinone (DNQ) group in the quinone diazide compound, as well as can form a cure film having excellent film retention rate even after post-bake.

5 Claims, No Drawings

PHOTOSENSITIVE RESIN COMPOSITION AND CURED FILM PREPARED THEREFROM

TECHNICAL FIELD

The present invention relates to a photosensitive resin composition and a cured film prepared therefrom. In particular, the present invention relates to a positive-type photosensitive resin composition, which provides excellent sensitivity and film retention rate, and a cured film prepared therefrom and used for a liquid crystal display, an organic EL display, and the like.

BACKGROUND ART

Generally, a transparent planarization film is formed on a thin film transistor (TFT) substrate for the purpose of insulation to prevent a contact between a transparent electrode and a data line in a liquid crystal display or an organic EL display. Through a transparent pixel electrode positioned near the data line, the aperture ratio of a panel may be increased, and high luminance/resolution may be attained. In order to form such a transparent planarization film, several processing steps are employed to impart a specific pattern profile, and a positive-type photosensitive resin composition is widely employed in this process since fewer processing steps are required. Particularly, a positive-type photosensitive resin composition containing a siloxane polymer is well known as a material having high heat resistance, high transparency, and low dielectric constant.

However, a planarization film or a display element using a conventional positive-type photosensitive siloxane composition has slower sensitivity than a planarization film and a display element using a negative-type photosensitive siloxane composition. Therefore, the sensitivity of the former needs to be improved.

Meanwhile, Korean Laid-Open Patent Publication No. 2008-0065984 discloses a positive-type photosensitive siloxane resin composition comprising a siloxane compound and 1-t-butoxy-2-propanol, teaching that 1-t-butoxy-2-propanol improves the coatability of the resin composition. Further, Korean Laid-Open Patent Publication No. 2010-0015288 discloses a positive-type resist composition comprising a binder resin, an acid generator, and an alcoholic organic solvent, teaching that, in case double patterning that employs positive-type compositions as both first and second resist compositions is carried out, it is effective to use the alcoholic solvent as a solvent for the second resist composition in order to prevent the first resist pattern from dissolving when the second resist is applied onto the first resist pattern. However, these patent publications are silent on improvement of the optical properties of a photosensitive resin composition, such as sensitivity, film retention rate, and the like, by the use of an alcoholic solvent.

PRIOR ART DOCUMENT

Patent Document (Patent Document 1) Korean Laid-open Patent Publication No. 2008-0065984

(Patent Document 2) Korean Laid-open Patent Publication No. 2010-0015288

DISCLOSURE OF INVENTION

Technical Problem

Accordingly, the present invention aims to provide a positive-type photosensitive resin composition that can improve the sensitivity by using an alcoholic solvent, which enhances the solubility in a developer through an interaction between the alcoholic solvent and the diazonaphthoquinone (DNQ) group of a quinone diazide compound, as well as can form a cured film having excellent film retention rate even after post-bake. The present invention also aims to provide a cured film formed from the composition and used for a liquid crystal display device, an organic EL display device, and the like.

Solution to Problem

In order to accomplish the above object, the present invention provides a photosensitive resin composition comprising (A) a siloxane polymer; (B) a 1,2-quinonediazide-based compound; and (C) a solvent comprising an alcohol, wherein the alcohol has a boiling point of 80 to 140° C. at atmospheric pressure.

Advantageous Effects of Invention

The positive-type photosensitive resin composition of the present invention can improve the sensitivity by using an alcoholic solvent having a low boiling point, along with a siloxane polymer and a quinonediazide compound conventionally used, which enhances the solubility of a portion exposed to light in a developer through an interaction between the alcohol and the diazonaphthoquinone (DNQ) group of the quinonediazide compound. Further, the photosensitive resin composition can provide a cured film having excellent film retention rate even after post-bake.

Best Mode for Carrying out the Invention

The photosensitive resin composition according to the present invention comprises (A) a siloxane polymer; (B) a 1,2-quinonediazide-based compound; and (C) a solvent comprising an alcohol, and may optionally further comprise (D) an epoxy compound, (E) at least one silane compound represented by Formula 2 below, (F) a surfactant, and/or (G) an adhesion assisting agent.

Hereinafter, each component of the photosensitive resin composition will be explained in detail.

In the present disclosure, "(meth)acryl" means "acryl" and/or "methacryl", and "(meth)acrylate" means "acrylate" and/or "methacrylate."

(A) Siloxane Polymer

The siloxane polymer (polysiloxane) includes a condensate of a silane compound and/or a hydrolysate thereof.

In this case, the silane compound or the hydrolysate thereof may be monofunctional to tetrafunctional silane compounds.

As a result, the siloxane polymer may comprise a siloxane structural unit selected from the following Q, T, D and M types.

Q type siloxane structural unit: a siloxane structural unit comprising a silicon atom and adjacent four oxygen atoms, which may be derived from e.g., a tetrafunctional silane compound or a hydrolysate of a silane compound having four hydroly sable groups.

T type siloxane structural unit: a siloxane structural unit comprising a silicon atom and adjacent three oxygen atoms, which may be derived from e.g., a trifunctional silane compound or a hydrolysate of a silane compound having three hydrolysable groups.

D type siloxane structural unit: a siloxane structural unit comprising a silicon atom and adjacent two oxygen atoms (i.e., linear siloxane structural unit), which may be derived from, e.g., a difunctional silane compound or a hydrolysate of a silane compound having two hydrolysable groups.

M type siloxane structural unit: a siloxane structural unit comprising a silicon atom and one adjacent oxygen atom, which may be derived from, e.g., a monofunctional silane compound or a hydrolysate of a silane compound having one hydrolysable group.

For example, the siloxane polymer (A) may comprise at least one structural unit derived from a silane compound represented by Formula 1 below, and the siloxane polymer may be, for example, a condensate of a silane compound represented by Formula 1 and/or a hydrolysate thereof.

$(R^1)_n Si(OR^2)_{4-n}$ [Formula 1]

In Formula 1 above, $R^1$ is $C_{1-12}$ alkyl, $C_{2-10}$ alkenyl, or $C_{6-15}$ aryl, wherein, in case that a plurality of $R^1$ are present in the same molecule, respective $R^1$s may be the same or different, and in case that $R^1$ is alkyl, alkenyl, or aryl, its hydrogen atoms may be substituted in part or entirely, and wherein $R^1$ may comprise a structural unit containing a heteroatom;

$R^2$ is hydrogen, $C_{1-6}$ alkyl, $C_{2-6}$ acyl, or $C_{6-15}$ aryl, wherein, in case that a plurality of $R^2$ are present in the same molecule, respective $R^e$s may be the same or different, and in case that $R^2$ is alkyl, acyl, or aryl, its hydrogen atoms may be substituted in part or entirely; and n is an integer of 0 to 3.

Examples of $R^1$ comprising a structural unit containing a heteroatom may include ether, ester, and sulfide.

The silane compound may be a tetrafunctional silane compound where n is 0, a trifunctional silane compound where n is 1, a difunctional silane compound where n is 2, or a monofunctional silane compound where n is 3.

Particular examples of the silane compound may include, e.g., as the tetrafunctional silane compound, tetraacetoxysilane, tetramethoxysilane, tetraethoxysilane, tetrabutoxysilane, tetraphenoxysilane, tetrabenzyloxysilane, and tetrapropoxysilane; as the trifunctional silane compound, methyltrichlorosilane, methyltrimethoxysilane, methyltriethoxysilane, methyltriisopropoxysilane, methyltributoxysilane, ethyltrimethoxysilane, ethyltriethoxysilane, ethyltriisopropoxysilane, ethyltributoxysilane, butyltrimethoxysilane, pentafluorophenyltrimethoxysilane, phenyltrimethoxysilane, phenyltriethoxysilane, $d^3$-methyltrimethoxysilane, nonafluorobutylethyltrimethoxysilane, trifluoromethyltrimethoxysilane, n-propyltrimethoxysilane, n-propyltriethoxysilane, n-butyltriethoxysilane, n-hexyltrimethoxysilane, n-hexyltriethoxysilane, decyltrimethoxysilane, vinyltrimethoxysilane, vinyltriethoxysilane, 3-methacryloxypropyltrimethoxysilane, 3-methacryloxypropyltriethoxysilane, 3-acryloxypropyltrimethoxysilane, 3-acryloxypropyltriethoxysilane, p-hydroxyphenyltrimethoxysilane, 1-(p-hydroxyphenyl)ethyltrimethoxysilane, 2-(p-hydroxyphenyl)ethyltrimethoxysilane, 4-hydroxy-5-(p-hydroxyphenylcarbonyloxy)pentyltrimethoxysilane, trifluoromethyltriethoxysilane, 3,3,3-trifluoropropyltrimethoxysilane, 3-aminopropyltrimethoxysilane, 3-aminopropyltriethoxysilane, 3-glycidoxypropyltrimethoxysilane, 3-glycidoxypropyltriethoxysilane, 2-(3,4-epoxycyclohexyl)ethyltrimethoxysilane, 2-(3,4-epoxycyclohexyl)ethyltriethoxysilane, [(3-ethyl-3-oxetanyl)methoxy]propyltrimethoxysilane, [(3-ethyl-3-oxetanyl)methoxy]propyltriethoxysilane, 3-mercaptopropyltrimethoxysilane, and 3-trimethoxysilylpropylsuccinic acid; as the difunctional silane compound, dimethyldiacetoxysilane, dimethyldimethoxysilane, diphenyldimethoxysilane, diphenyldiethoxysilane, diphenyldiphenoxysilane, dibutyldimethoxysilane, dimethyldiethoxysilane, (3-glycidoxypropyl)methyldimethoxysilane, (3-glycidoxypropyl)methyldiethoxysilane, 3-(2-aminoethylamino)propyldimethoxymethylsilane, 3-aminopropyldiethoxymethylsilane, 3-chloropropyldimethoxymethylsilane, 3-mercaptopropyldimethoxymethylsilane, cyclohexyldimethoxymethylsilane, diethoxymethylvinylsilane, dimethoxymethylvinylsilane, and dimethoxydi-p-tolylsilane; and as the monofunctional silane compound, trimethylsilane, tributylsilane, trimethylmethoxysilane, tributylethoxysilane, (3-glycidoxypropyl)dimethylmethoxysilane, and (3-glycidoxypropyl)dimethylethoxysilane.

Preferred among the tetrafunctional silane compounds are tetramethoxysilane, tetraethoxysilane, and tetrabutoxysilane; preferred among the trifunctional silane compounds are methyltrimethoxysilane, methyltriethoxysilane, methyltriisopropoxysilane, methyltributoxysilane, phenyltrimethoxysilane, ethyltrimethoxysilane, ethyltriethoxysilane, ethyltriisopropoxysilane, ethyltributoxysilane, and butyltrimethoxysilane; preferred among the difunctional silane compounds are dimethyldimethoxysilane, diphenyldimethoxysilane, diphenyldiethoxysilane, diphenyldiphenoxysilane, dibutyldimethoxysilane, and dimethyldiethoxysilane.

These silane compounds may be used alone or in combination of two or more thereof.

The conditions for preparing the hydrolysate of the silane compound represented by Formula 1 above or the condensate thereof are not specifically limited. For example, the desired hydrolysate or the condensate may be prepared by diluting the silane compound of Formula 1 in a solvent such as ethanol, 2-propanol, acetone, and butyl acetate; adding thereto water necessary for the reaction, and, as a catalyst, an acid (e.g., hydrochloric acid, acetic acid, nitric acid, and the like) or a base (e.g., ammonia, triethylamine, cyclohexylamine, tetramethylammonium hydroxide, and the like); and then stirring the mixture thus obtained to complete the hydrolytic polymerization reaction.

The weight average molecular weight of the condensate (siloxane polymer) obtained by the hydrolytic polymerization of the silane compound of Formula 1 is preferably in a range of 500 to 50,000. Within this range, the photosensitive resin composition may have desirable film forming properties, solubility, and dissolution rates in a developer.

The kinds of the solvent and the acid or base catalyst used in the preparation and the amounts thereof may be optionally selected without specific limitation. The hydrolytic polymerization may be carried out at a low temperature of 20° C. or less, but the reaction may also be promoted by heating or refluxing. The time required for the reaction may vary depending on various conditions including the kind and concentration of the silane monomer, reaction temperature, etc. Generally, the reaction time required for obtaining a condensate having a weight average molecular weight of about 500 to 50,000 is in a range of 15 minutes to 30 days; however, the reaction time in the present invention is not limited thereto.

The siloxane polymer (A) may comprise a linear siloxane structural unit (i.e., D-type siloxane structural unit). The linear siloxane structural unit may be derived from a difunctional silane compound, for example, a silane compound represented by Formula 1 where n is 2. Particularly, the siloxane polymer (A) comprises the structural unit derived from the silane compound of Formula 1 where n is 2 in an amount of 0.5 to 50 mole %, and preferably 1 to 30 mole %, based on an Si atomic mole number. Within this range, a cured film may maintain constant hardness, and exhibit flexible properties, thereby further improving crack resistance with respect to external stress.

Further, the siloxane polymer (A) may comprise a structural unit derived from a silane compound represented by Formula 1 where n is 1 (i.e., T-type structural unit). Preferably, the siloxane polymer (A) comprises the structural unit derived from the silane compound represented by Formula 1 where n is 1, in an amount ratio of 40 to 85 mole %, more preferably 50 to 80 mole %, based on an Si atomic mole number. Within this amount range, the photosensitive resin composition may form a cured film with a more precise pattern profile.

In addition, in consideration of the hardness, sensitivity, and retention rate of a cured film, it is preferable that the siloxane polymer (A) comprises a structural unit derived from a silane compound having an aryl group. For example, the siloxane polymer (A) may comprise a structural unit derived from a silane compound having an aryl group in an amount of 30 to 70 mole %, and preferably 35 to 50 mole %, based on an Si atomic mole number. Within this range, the compatibility of a siloxane polymer and an 1,2-naphthoquinonediazide compound is good, and thus the excessive decrease in sensitivity may be prevented while attaining more favorable transparency of a cured film. The structural unit derived from the silane compound having an aryl group as $R^1$ may be a structural unit derived from a silane compound of Formula 1 where n is 1 and $R^1$ is an aryl group, particularly a silane compound of Formula 1 where n is 1 and $R^1$ is phenyl (i.e., T-phenyl type structural unit).

The siloxane polymer (A) may comprise a structural unit derived from a silane compound represented by Formula 1 where n is 0 (i.e., Q-type structural unit). Preferably, the siloxane polymer (A) comprises the structural unit derived from the silane compound represented by Formula 1 where n is 0, in an amount of 10 to 40 mole %, and preferably 15 to 35 mole % based on an Si atomic mole number. Within this range, the photosensitive resin composition may maintain its solubility in an aqueous alkaline solution at a proper degree during forming a pattern, thereby preventing any defects caused by a reduction in the solubility or a drastic increase in the solubility of the composition.

The term "mole % based on the Si atomic mole number" as used herein refers to the percentage of the number of moles of Si atoms contained in a specific structural unit with respect to the total number of moles of Si atoms contained in all of the structural units constituting the siloxane polymer.

The molar amount of the siloxane unit in the siloxane polymer (A) may be measured from the combination of Si—NMR, $^1$H-NMR, $^{13}$C-NMR, IR, TOF-MS, elementary analysis, determination of ash, and the like. For example, in order to measure the mole amount of a siloxane unit having a phenyl group, an Si-NMR analysis is performed on a total siloxane polymer, a phenyl bound Si peak area and a phenyl unbound Si peak area are then analyzed, and the mole amount can thus be computed from the peak area ratio therebetween.

The photosensitive resin composition of the present invention may comprise the siloxane polymer (A) in an amount of 50 to 95 wt %, preferably 65 to 90 wt %, based on the total weight of the composition on the basis of the solid content excluding solvents. Within this amount range, the resin composition can maintain its developability at a suitable level, thereby producing a cured film with improved film retention rate and pattern resolution.

(B) 1,2-Quinonediazide Compound

The photosensitive resin composition of the present invention comprises a 1,2-quinonediazide compound (B).

The 1,2-quinonediazide compound may be any compound used as a photosensitive agent in the photoresist field.

Examples of the 1,2-quinonediazide compound include an ester of a phenolic compound and 1,2-benzoquinonediazide-4-sulfonic acid or 1,2-benzoquinonediazide-5-sulfonic acid; an ester of a phenolic compound and 1,2-naphthoquinonediazide-4-sulfonic acid or 1,2-naphthoquinonediazide-5-sulfonic acid; a sulfonamide of a phenolic compound in which a hydroxyl group is substituted with an amino group and 1,2-benzoquinonediazide-4-sulfonic acid or 1,2-benzoquinonediazide-5-sulfonic acid; a sulfonamide of a phenolic compound in which a hydroxyl group is substituted with an amino group and 1,2-naphthoquinonediazide-4-sulfonic acid or 1,2-naphthoquinonediazide-5-sulfonic acid. The above compounds may be used alone or in combination of two or more compounds, and the like.

Examples of the phenolic compound include 2,3,4-trihydroxybenzophenone, 2,4,6-trihydroxybenzophenone, 2,2',4,4'-tetrahydroxybenzophenone, 2,3,3',4-tetrahydroxybenzophenone, 2,3,4,4'-tetrahydroxybenzophenone, bis(2,4-dihydroxyphenyl)methane, bis(p-hydroxyphenyl)methane, tri(p-hydroxyphenyl)methane, 1,1,1-tri(p-hydroxyphenypethane, bis(2,3,4-trihydroxyphenyl)methane, 2,2-bis(2,3,4-trihydroxyphenyl)propane, 1,1,3-tris(2,5-dimethyl-4-hydroxyphenyl)-3-phenylpropane, 4,4'-[1-[4-[1-[4-hydroxyphenyl]-1-methylethyl]phenyl]ethylidene]bisphenol, bis(2,5-dimethyl-4-hydroxyphenyl)-2-hydroxyphenylmethane, 3,3,3',3'-tetramethyl-1,1'-spirobiindene-5,6,7,5',6',7'-hexanol, 2,2,4-trimethyl-7,2',4'-trihydroxyflavane, and the like.

More particular examples of the 1,2-quinonediazide compound include an ester of 2,3,4-trihydroxybenzophenone and 1,2-naphthoquinonediazide-4-sulfonic acid, an ester of 2,3,4-trihydroxybenzophenone and 1,2-naphthoquinonediazide-5-sulfonic acid, an ester of 4,4'-[1-[4-[1-[4-hydroxyphenyl]-1-methylethyl]phenyl]ethylidene]bisphenol and 1,2-naphthoquinonediazide-4-sulfonic acid, an ester of 4,4'-[1-[4-[1-[4-hydroxyphenyl]-1-methylethyl]phenyl]ethylidene]bisphenol and 1,2-naphthoquinonediazide-5-sulfonic acid, and the like.

The above compounds may be used alone or in combination of two or more compounds.

By using the aforementioned preferable compounds, the transparency of the positive-type photosensitive resin composition may be improved.

The 1,2-quinonediazide compound (B) may be comprised in the photosensitive resin composition in an amount ranging from 2 to 50 parts by weight, preferably 5 to 20 parts by weight, based on 100 parts by weight of the siloxane polymer (A) on the basis of the solid content excluding solvents. When the 1,2-quinonediazide compound is used in the above amount range, the resin composition may more readily form a pattern, without defects such as a rough surface of a coated film and scum at the bottom portion of the pattern upon development.

(C) Solvent Comprising an Alcohol

The photosensitive resin composition of the present invention comprises a solvent (C) comprising an alcohol. The alcohol may have a boiling point of 80 to 140° C., particularly 80 to 120° C., at atmospheric pressure. The solvent (C) comprising the alcohol having a boiling point in the above range can improve the sensitivity by enhancing the solubility in a developer through an interaction between the alcohol and the diazonaphthoquinone (DNQ) group of the quinone diazide compound.

Generally, the diazonaphthoquinone group changes to a diazoketone group by UV light during the light exposure step. The resulting diazoketone is subject to react with a small amount of water ($H_2O$) which is present in a photoresist composition, thereby changing to a structure comprising a carboxyl group that is easy to dissolve in an alkaline developer. In the relevant technical field, for the purpose of promoting the aforementioned reaction, water has been added to the photoresist composition. But, in this case, due to presence of a large amount of water, the stability of the photoresist composition decreased as time passed. Hence, in order to solve this problem, the present invention can improve the sensitivity by enhancing the solubility of the diazonaphthoquinone in a developer by way of using alcohol instead of water. Such a reaction mechanism is shown in the following Reaction Scheme 1.

[Reaction Scheme 1]

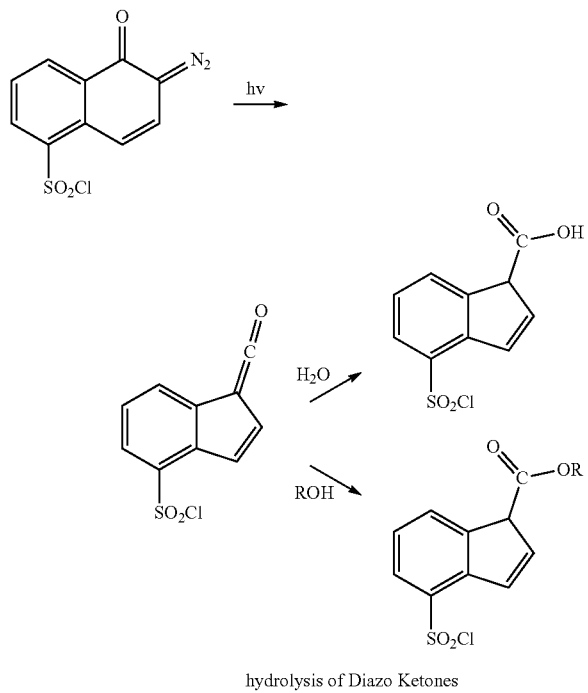

hydrolysis of Diazo Ketones

The content of the solvent in the photosensitive resin composition is not particularly limited. For example, the solvent may be comprised such that the solid content is 10 to 70% by weight, preferably 15 to 60% by weight, based on the total weight of the photosensitive resin composition. The solid content refers to the components constituting the resin composition of the present invention, excluding solvents. If the content of the solvent is within the above range, a coating can be easily formed, and the flowability can be maintained at an appropriate level.

Furthermore, the alcohol may be comprised in an amount of 1 to 78% by weight, preferably 5 to 60% by weight, more preferably 10 to 50% by weight, based on the total weight of the solvent (C). Within the above content range, a pattern is easily formed even with a small amount of exposure energy, and the film retention rate can be kept at a high level at the time of development after the post-bake.

The alcohol may be preferably isopropyl alcohol, n-propyl alcohol, isobutyl alcohol, n-butyl alcohol, sec-butyl alcohol, t-butyl alcohol, 2-methyl-1-butanol, 2-methyl-2-butanol, 1-methoxy-2-butanol, 1-pentanol, 4-methyl-2-pentanol, allyl alcohol, ethylene glycol monomethyl ether, ethylene glycol monoethyl ether, propylene glycol monomethyl ether, propylene glycol monoethyl ether, N,N-dimethyl ethanolamine, or the like; and more preferably isopropyl alcohol, n-propyl alcohol, isobutyl alcohol, n-butyl alcohol, sec-butyl alcohol, t-butyl alcohol, 2-methy-2-butanol, allyl alcohol, propylene glycol monomethyl ether, or the like, which have a boiling point of 80 to 120° C.

The above alcohols may be used alone or in combination of two or more thereof.

Furthermore, the solvent (C) may comprise another solvent in addition to the alcohol. This additional solvent may be an organic solvent. Examples thereof include ethers, diethylene glycol alkyl ethers, ethylene glycol alkyl ether acetates, propylene glycol monoalkyl ether acetates, propylene glycol monoalkyl ether propionates, aromatic hydrocarbons, ketones, esters, and the like.

Specifically, the additional solvent may be ethers such as tetrahydrofuran; diethylene glycol alkyl ethers such as diethylene glycol dimethyl ether, diethylene glycol ether, and diethylene glycol ethyl methyl ether; ethylene glycol alkyl ether acetates such as methyl cellosolve acetate, ethyl cellosolve acetate, ethylene glycol monobutyl ether acetate, and ethylene glycol monoethyl ether acetate; propylene glycol monoalkyl ether acetates such as propylene glycol monomethyl ether acetate, propylene glycol monoethyl ether acetate, propylene glycol monopropyl ether acetate, and propylene glycol monobutyl ether acetate; propylene glycol monoalkyl ether propionates such as propylene glycol monomethyl ether propionate, propylene glycol monoethyl ether propionate, propylene glycol monopropyl ether propionate, and propylene glycol monobutyl ether propionate; aromatic hydrocarbons such as toluene and xylene; ketones such as methyl ethyl ketone, methyl isobutyl ketone, cyclohexanone, 2-heptanone, and 4-hydroxy-4-methyl-2-pentanone; esters such as methyl acetate, ethyl acetate, propyl acetate, i-propyl acetate, butyl acetate, ethyl 2-hydroxypropionate, methyl 2-hydroxy-2-methylpropionate, ethyl 2-hydroxy-2-methylpropionate, methyl hydroxyacetate, ethyl hydroxyacetate, butyl hydroxyacetate, methyl lactate, ethyl lactate, propyl lactate, butyl lactate, methyl 3-hydroxypropionate, ethyl 3-hydroxypropionate, propyl 3-hydroxypropionate, butyl 3-hydroxypropionate, methyl 2-hydroxy-3-methylbutanoate, methyl methoxyacetate, ethyl methoxyacetate, propyl methoxy acetate, butyl methoxyacetate, methyl ethoxyacetate, ethyl ethoxyacetate, propyl ethoxyacetate, butyl ethoxyacetate, methyl propoxyacetate, ethyl propoxyacetate, propyl propoxyacetate, butyl propoxyacetate, methyl butoxyacetate, ethyl butoxyacetate, propyl butoxyacetate, butyl butoxyacetate, methyl 2-methoxypropionate, ethyl 2-methoxypropionate, propyl 2-methoxypropionate, butyl 2-methoxypropionate, methyl 2-ethoxypropionate, and ethyl 2-ethoxypropionate.

The above solvents may be used alone or in combination of two or more thereof.

(D) Epoxy Compound

In the photosensitive resin composition of the present invention, an epoxy compound may additionally be employed together with the siloxane polymer so as to increase the internal density of a siloxane binder, to thereby improve the chemical resistance of a cured film to be prepared therefrom.

The epoxy compound may be a homo-oligomer or a hetero-oligomer of an unsaturated monomer containing at least one epoxy group.

Examples of the unsaturated monomer containing at least one epoxy group may include glycidyl (meth)acrylate, 4-hydroxybutylacrylate glycidyl ether, 3,4-epoxybutyl (meth)acrylate, 4,5-epoxypentyl (meth)acrylate, 5,6-epoxyhexyl (meth)acrylate, 6,7-epoxyheptyl (meth)acrylate, 2,3-epoxycyclopentyl (meth)acrylate, 3,4-epoxycyclohexyl (meth)acrylate, α-ethyl glycidyl acrylate, α-n-propyl glycidyl acrylate, α-n-butyl glycidyl acrylate, N-(4-(2,3-epoxypropoxy)-3,5-dimethylbenzyl)acrylamide, N-(4-(2,3-epoxypropoxy)-3,5-dimethylphenylpropyl)acrylamide, allyl glycidyl ether, 2-methylallyl glycidyl ether, o-vinylbenzyl glycidyl ether, m-vinylbenzyl glycidyl ether, p-vinylbenzyl glycidyl ether, or a mixture thereof. Preferably, glycidyl methacrylate may be used.

The epoxy compound may be synthesized by any conventional methods well known in the art.

An example of the commercially available epoxy compound may include GHP03 (glycidyl methacrylate homopolymer, Miwon Commercial Co., Ltd.).

The epoxy compound (D) may further comprise the following structural units.

Particular examples may include any structural unit derived from styrene; a styrene having an alkyl substituent such as methylstyrene, dimethylstyrene, trimethylstyrene, ethylstyrene, diethylstyrene, triethylstyrene, propylstyrene, butylstyrene, hexylstyrene, heptylstyrene, and octylstyrene; a styrene having a halogen such as fluorostyrene, chlorostyrene, bromostyrene, and iodostyrene; a styrene having an alkoxy substituent such as methoxystyrene, ethoxystyrene, and propoxystyrene; p-hydroxy-α-methylstyrene, acetylstyrene; an ethylenically unsaturated compound having an aromatic ring such as divinylbenzene, vinylphenol, o-vinylbenzyl methyl ether, m-vinylbenzyl methyl ether, and p-vinylbenzyl methyl ether; an unsaturated carboxylic acid ester such as methyl (meth)acrylate, ethyl (meth)acrylate, butyl (meth)acrylate, dimethylaminoethyl (meth)acrylate, isobutyl (meth)acrylate, t-butyl (meth)acrylate, cyclohexyl (meth)acrylate, ethylhexyl (meth)acrylate, tetrahydrofurfuryl (meth)acrylate, hydroxyethyl (meth)acrylate, 2-hydroxypropyl (meth)acrylate, 2-hydroxy-3-chloropropyl (meth)acrylate, 4-hydroxybutyl (meth)acrylate, glycerol (meth)acrylate, methyl α-hydroxymethylacrylate, ethyl α-hydroxymethylacrylate, propyl α-hydroxymethylacrylate, butyl α-hydroxymethylacrylate, 2-methoxyethyl (meth)acrylate, 3-methoxybutyl (meth)acrylate, ethoxy diethylene glycol (meth)acrylate, methoxy triethylene glycol (meth)acrylate, methoxy tripropylene glycol (meth)acrylate, poly(ethylene glycol) methyl ether (meth)acrylate, phenyl (meth)acrylate, benzyl (meth)acrylate, 2-phenoxyethyl (meth)acrylate, phenoxy diethylene glycol (meth)acrylate, p-nonylphenoxy polyethylene glycol (meth)acrylate, p-nonylphenoxy polypropylene glycol (meth)acrylate, tetrafluoropropyl (meth)acrylate, 1,1,1,3,3,3-hexafluoroisopropyl (meth)acrylate, octafluoropentyl (meth)acrylate, heptadecafluorodecyl (meth)acrylate, tribromophenyl (meth)acrylate, isobornyl (meth)acrylate, dicyclopentanyl (meth)acrylate, dicyclopentenyl (meth)acrylate, dicyclopentanyloxyethyl (meth)acrylate, and dicyclopentenyloxyethyl (meth)acrylate; a tertiary amine having an N-vinyl group such as N-vinyl pyrrolidone, N-vinyl carbazole, and N-vinyl morpholine; an unsaturated ether such as vinyl methyl ether, and vinyl ethyl ether; an unsaturated imide such as N-phenylmaleimide, N-(4-chlorophenyl)maleimide, N-(4-hydroxyphenyl)maleimide, and N-cyclohexylmaleimide. The structural unit derived from the above exemplary compounds may be contained in the epoxy compound (D) alone or in combination of two or more thereof.

For polymerizability of the composition, styrene compounds are preferred among these examples.

Particularly, in terms of chemical resistance, it is more preferable that the epoxy compound (D) does not contain a carboxyl group, by not using a structural unit derived from a monomer containing a carboxyl group among these compounds.

The structural unit may be used in an amount ratio of 0 to 70 mole %, preferably 10 to 60 mole %, based on the total number of moles of the structural units constituting the epoxy compound (D). Within this amount range, a cured film may have desirable hardness.

The weight average molecular weight of the epoxy compound (D) may be in a range of 100 to 30,000, preferably 1,000 to 15,000. If the weight average molecular weight of the epoxy compound is at least 100, a cured film may have improved hardness. Also, if the weight average molecular weight of the epoxy compound is 30,000 or less, a cured film may have a uniform thickness, which is suitable for planarizing any steps thereon. The weight average molecular weight is determined by gel permeation chromatography (GPC, eluent: tetrahydrofuran) using polystyrene standards.

The epoxy compound (D) may be comprised in the photosensitive resin composition of the present invention in an amount of 0 to 40 parts by weight, preferably 5 to 25 parts by weight, based on 100 parts by weight of the solid content of the siloxane polymer (A) excluding solvents. Within the amount range, the chemical resistance and sensitivity of the photosensitive resin composition may be more favorable.

(E) Silane Compound

The photosensitive resin composition of the present invention may comprise at least one silane compound represented by Formula 2 below, especially silane monomers of T type and/or Q type, to thereby improve the chemical resistance during the treatment in the post-processing by reducing highly reactive silanol groups (Si—OH) in the siloxane polymer, in association with the epoxy compound, for instance epoxy oligomers:

   [Formula 2]

In Formula 2 above, $R^3$ is $C_{1-12}$ alkyl, $C_{2-10}$ alkenyl, or $C_{6-15}$ aryl, wherein, in case that a plurality of $R^3$ are present in the same molecule, respective $R^a$s may be the same or different, and in case that $R^3$ is alkyl, alkenyl, or aryl, its hydrogen atoms may be substituted in part or entirely, and wherein $R^3$ may comprise a structural unit containing a heteroatom;

$R^4$ is hydrogen, $C_{1-6}$ alkyl, $C_{2-6}$ acyl, or $C_{6-15}$ aryl, wherein, in case that a plurality of $R^4$ are present in the same molecule, respective $R^4$s may be the same or different, and in case that $R^4$ is alkyl, acyl, or aryl, its hydrogen atoms may be substituted in part or entirely; and n is an integer of 0 to 3.

Examples of $R^3$ comprising a structural unit containing a heteroatom may include ether, ester, and sulfide.

The silane compound may be a tetrafunctional silane compound where n is 0, a trifunctional silane compound where n is 1, a difunctional silane compound where n is 2, or a monofunctional silane compound where n is 3.

Particular examples of the silane compound may include, e.g., as the tetrafunctional silane compound, tetraacetoxysilane, tetramethoxysilane, tetraethoxysilane, tetrabutoxysilane, tetraphenoxysilane, tetrabenzyloxysilane, and tetrapropoxysilane; as the trifunctional silane compound, methyltrimethoxysilane, methyltriethoxysilane, methyltriisopropoxysilane, methyltributoxysilane, ethyltrimethoxysilane, ethyltriethoxysilane, ethyltriisopropoxysilane, ethyltributoxysilane, butyltrimethoxysilane, phenyltrimethoxysilane, phenyltriethoxysilane, $d^3$-methyltrimethoxysilane, n-propyltrimethoxysilane, n-propyltriethoxysilane, n-butyltriethoxysilane, n-hexyltrimethoxysilane, n-hexyltriethoxysilane, decyltrimethoxysilane, vinyltrimethoxysilane, vinyltriethoxysilane, 3-methacryloxypropyltrimethoxysilane, 3-methacryloxypropyltriethoxysilane, 3-acryloxypropyltrimethoxysilane, 3-acryloxypropyltriethoxysilane, p-hydroxyphenyltrimethoxysilane, 1-(p-hydroxyphenyl)ethyltrimethoxysilane, 2-(p-hydroxyphenyl)ethyltrimethoxysilane, 4-hydroxy-5-(p-hydroxyphenylcarbonyloxy)pentyltrimethoxysilane, 3-aminopropyltrimethoxysilane, 3-aminopropyltriethoxysilane, 3-glycidoxypropyltrimethoxysilane, 3-glycidoxypropyltriethoxysilane, 2-(3,4-epoxycyclohexyl)ethyltrimethoxysilane, 2-(3,4-epoxycyclohexyl)ethyltriethoxysilane, [(3-ethyl-3-oxetanyl)methoxy]propyltrimethoxysilane, [(3-ethyl-3-oxetanyl)methoxy]propyltriethoxysilane, 3-mercaptopropyltrimethoxysilane, and 3-trimethoxysilylpropylsuccinic acid; as the difunctional silane compound, dimethyldiacetoxysilane, dimethyldimethoxysilane, diphenyldimethoxysilane, diphenyldiethoxysilane, diphenyldiphenoxysilane, dibutyldimethoxysilane, dimethyldiethoxysilane, (3-glycidoxypropyl)methyldimethoxysilane, (3-glycidoxypropyl)methyldiethoxysilane, 3-(2-aminoethylamino)propyldimethoxymethylsilane, 3-aminopropyldiethoxymethylsilane, 3-mercaptopropyldimethoxymethylsilane, cyclohexyldimethoxymethylsilane, diethoxymethylvinylsilane, dimethoxymethylvinylsilane, and dimethoxydi-p-tolylsilane; and as the monofunctional silane compound, trimethylsilane, tributylsilane, trimethylmethoxysilane, tributylethoxysilane, (3-glycidoxypropyl)dimethylmethoxysilane, and (3-glycidoxypropyl)dimethylethoxysilane.

Preferred among the tetrafunctional silane compounds are tetramethoxysilane, tetraethoxysilane, and tetrabutoxysilane; preferred among the trifunctional silane compounds are methyltrimethoxysilane, methyltriethoxysilane, methyltriisopropoxysilane, methyltributoxysilane, phenyltrimethoxysilane, ethyltrimethoxysilane, ethyltriethoxysilane, ethyltriisopropoxysilane, ethyltributoxysilane, butyltrimethoxysilane, 3-glycidoxypropyltrimethoxysilane, 3-glycidoxypropyltriethoxysilane, 2-(3,4-epoxycyclohexyl)ethyltrimethoxysilane, 2-(3,4-epoxycyclohexyl)ethyltriethoxysilane; preferred among the difunctional silane compounds are dimethyldimethoxysilane, diphenyldimethoxysilane, diphenyldiethoxysilane, diphenyldiphenoxysilane, dibutyldimethoxysilane, and dimethyldiethoxysilane.

These silane compounds may be used alone or in combination of two or more thereof.

The silane compound (E) may be comprised in the photosensitive resin composition in an amount of 0 to 20 parts by weight, preferably 4 to 12 parts by weight, based on 100 parts by weight of the solid content of the siloxane polymer (A) excluding solvents. Within the amount range, the chemical resistance of a cured film to be formed may be further improved.

(F) Surfactant

The photosensitive resin composition of the present invention may further comprise a surfactant to enhance its coatability.

The kind of the surfactant is not limited, but preferred are fluorine-based surfactants, silicon-based surfactants, non-ionic surfactants, and the like.

Specific examples of the surfactants may include fluorine- and silicon-based surfactants such as FZ-2122 manufactured by Dow Corning Toray Silicon Co., Ltd., BM-1000, and BM-1100 manufactured by BM CHEMIE Co., Ltd., Megapack F-142 D, Megapack F-172, Megapack F-173, and Megapack F-183 manufactured by Dai Nippon Ink Chemical Kogyo Co., Ltd., Florad FC-135, Florad FC-170 C, Florad FC-430, and Florad FC-431 manufactured by Sumitomo 3M Ltd., Sufron S-112, Sufron S-113, Sufron S-131, Sufron S-141, Sufron S-145, Sufron S-382, Sufron SC-101, Sufron SC-102, Sufron SC-103, Sufron SC-104, Sufron SC-105, and Sufron SC-106 manufactured by Asahi Glass Co., Ltd., Eftop EF301, Eftop EF303, and Eftop EF352 manufactured by Shinakida Kasei Co., Ltd., SH-28 PA, SH-190, SH-193, SZ-6032, SF-8428, DC-57, and DC-190 manufactured by Toray Silicon Co., Ltd.; non-ionic surfactants such as polyoxyethylene alkyl ethers including polyoxyethylene lauryl ether, polyoxyethylene stearyl ether, polyoxyethylene oleyl ether, and the like, polyoxyethylene aryl ethers including polyoxyethylene octylphenyl ether, polyoxyethylene nonylphenyl ether, and the like, and polyoxyethylene dialkyl esters including polyoxyethylene dilaurate, polyoxyethylene distearate, and the like; and organosiloxane polymer KP341 (manufactured by Shin-Etsu Chemical Co., Ltd.), (meth)acrylate-based copolymer Polyflow No. 57 and 95 (Kyoei Yuji Chemical Co., Ltd.), and the like. They may be used alone or in combination of two or more thereof.

The surfactant (F) may be comprised in the photosensitive resin composition in an amount of 0.001 to 5 parts by weight, preferably 0.05 to 2 parts by weight, based on 100 parts by weight of the solid content of the siloxane polymer (A) excluding solvents. Within the amount range, the coatability of the composition may be improved.

(G) Adhesion Assisting Agent

The photosensitive resin composition of the present invention may further comprise an adhesion assisting agent to improve its adhesiveness to a substrate.

The adhesion assisting agent may comprise at least one reactive group selected from the group consisting of a carboxyl group, a (meth)acryloyl group, an isocyanate group, an amino group, a mercapto group, a vinyl group, and an epoxy group.

The kind of the adhesion assisting agent is not specifically limited, and examples thereof may include at least one selected from the group consisting of trimethoxysilyl benzoic acid, α-methacryloxypropyltrimethoxysilane, vinyltriacetoxysilane, vinyltrimethoxysilane, α-isocyanatopropyltriethoxysilane, γ-glycidoxypropyltrimethoxysilane, γ-glycidoxypropyltriethoxysilane, N-phenylaminopropyltrimethoxysilane, and β-(3,4-epoxycyclohexyl)ethyltrimethoxysilane, and preferable examples may include γ-glycidoxypropyltriethoxysilane, γ-glycidoxypropyltrimethoxysilane, or N-phenylaminopropyltrimethoxysilane, which may increase film retention rate and have good adhesiveness to a substrate.

The adhesion assisting agent (G) may be comprised in the photosensitive resin composition in an amount of 0 to 5 parts by weight, preferably 0.001 to 2 parts by weight, based on 100 parts by weight of the solid content of the siloxane polymer (A) excluding solvents. Within the amount range, the adhesiveness to a substrate may be further improved.

In addition to the above, other additive components may be comprised in the photosensitive resin composition of the present invention only if the physical properties thereof are not adversely affected.

The photosensitive resin composition according to the present invention may be used as a positive-type photosensitive resin composition.

Particularly, the photosensitive resin composition of the present invention can improve the sensitivity by using an alcoholic solvent having a low boiling point, along with a siloxane polymer and a quinone diazide compound conventionally used, which enhances the solubility of a portion exposed to light in a developer when the diazonaphthoquinone (DNQ) group of the quinone diazide compound is exposed during the light exposure step. Further, the photosensitive resin composition can provide a cured film having excellent film retention rate even after post-bake.

Further, the present invention provides a cured film formed from the photosensitive resin composition.

The cured film may be formed by a method known in the art, for example, a method in which the photosensitive resin composition is coated on a substrate and then cured.

Here, the coating step may be carried out by a spin coating method, a slit coating method, a roll coating method, a screen printing method, an applicator method, or the like, in a desired thickness of, e.g., 2 to 25 μm.

In the curing step, specifically, the photosensitive resin composition coated on a substrate may be subjected to pre-bake at a temperature of, for example, 60 to 130° C. to remove solvents; then exposed to light using a photomask having a desired pattern; and subjected to development using a developer, for example, a tetramethylammonium hydroxide (TMAH) solution, to form a pattern on the coating layer. Here, the light exposure may be carried out at an exposure rate of 10 to 200 mJ/cm$^2$ based on a wavelength of 365 nm in a wavelength band of 200 to 500 nm. Further, as a light source used for the exposure (irradiation), a low-pressure mercury lamp, a high-pressure mercury lamp, an extra high-pressure mercury lamp, a metal halide lamp, an argon gas laser, etc., may be used. X-ray, electronic ray, etc., may also be used, if desired.

Thereafter, if necessary, the patterned coating layer is subjected to post-bake, for example, at a temperature of 150 to 300° C. for 10 minutes to 5 hours to prepare a desired cured film.

The cured film thus prepared has excellent physical properties in terms of heat resistance, transparency, dielectricity, solvent resistance, acid resistance, and alkali resistance.

Therefore, the cured film has excellent light transmittance devoid of surface roughness when the composition is subjected to heat treatment or is immersed in, or comes into contact with a solvent, an acid, a base, etc. Thus, the cured film can be used effectively as a planarization film for a TFT substrate of a liquid crystal display or an organic EL display; a partition of an organic EL display; an interlayer dielectric of a semiconductor device; a core or cladding material of an optical waveguide, etc.

Further, the present invention provides a silicon-containing cured film formed by the above preparation method, and electronic parts including the cured film as a protective film.

Mode for the Invention

Hereinafter, the present invention will be described in more detail with reference to the following examples. However, these examples are only provided to illustrate the present invention, and the scope of the present invention is not limited thereto.

In the following examples, the weight average molecular weight is determined by gel permeation chromatography (GPC) using a polystyrene standard.

EXAMPLE

Synthesis Example 1

Synthesis of a Siloxane Polymer (A-1)

To a reactor equipped with a reflux condenser, 40 wt % of phenyltrimethoxysilane, 15 wt % of methyltrimethoxysilane, 20 wt % of tetraethoxysilane, and 20 wt % of pure water were added, and then 5 wt % of propylene glycol monomethyl ether acetate (PGMEA) were added thereto, followed by refluxing and stirring the mixture in the presence of 0.1 wt % of an oxalic acid catalyst for 7 hours and then cooling it. After that, the reaction product was diluted with PGMEA so that the solid content was 40 wt %. A siloxane polymer having a weight average molecular weight of about 5,000 to 8,000 Da was synthesized.

Synthesis Example 2

Synthesis of a Siloxane Polymer (A-2) To a reactor equipped with a reflux condenser, 20 wt % of phenyltrimethoxysilane, 30 wt % of methyltrimethoxysilane, 20 wt % of tetraethoxysilane, and 15 wt % of pure water were added, and then 15 wt % of PGMEA were added thereto, followed by refluxing and stirring the mixture in the presence of 0.1 wt % of an oxalic acid catalyst for 6 hours and then cooling it. After that, the reaction product was diluted with PGMEA so that the solid content was 30 wt %. A siloxane polymer having a weight average molecular weight of about 8,000 to 13,000 Da was synthesized.

Synthesis Example 3

Synthesis of a Siloxane Polymer (A-3)

To a reactor equipped with a reflux condenser, 20 wt % of phenyltrimethoxysilane, 30 wt % of methyltrimethoxysilane, 20 wt % of tetraethoxysilane, and 15 wt % of pure water were added, and then 15 wt % of PGMEA were added thereto, followed by refluxing and stirring the mixture in the presence of 0.1 wt % of an oxalic acid catalyst for 5 hours, and then cooling it. After that, the reaction product was diluted with PGMEA so that the solid content was 30 wt %. A siloxane polymer having a weight average molecular weight of about 9,000 to 15,000 Da was synthesized.

TABLE 1

| Siloxane polymer (A) | Phenyl-trimethoxy-silane | Methyl-trimethoxy-silane | Tetraethoxy-silane | Pure water | PGMEA | Solid content (wt %) | Wt. avg. M.W. (Da) |
|---|---|---|---|---|---|---|---|
| Syn. Ex. 1 (A-1) | 40 | 15 | 20 | 20 | 5 | 40 | 5,000-8,000 |
| Syn. Ex. 2 (A-2) | 20 | 30 | 20 | 15 | 15 | 30 | 8,000-13,000 |
| Syn. Ex. 3 (A-3) | 20 | 30 | 20 | 15 | 15 | 30 | 9,000-15,000 |

Synthesis Example 4

Synthesis of an Epoxy Compound

A three-necked flask equipped with a condenser was placed on a stirrer with an automatic temperature controller. 100 parts by weight of a monomer including glycidyl methacrylate (100 mole %), 10 parts by weight of 2,2'-azobis(2-methylbutyronitrile), and 100 parts by weight of PGMEA were put in the flask, and the flask was charged with nitrogen. The flask was heated to 80° C. while stirring the mixture slowly, and the temperature was maintained for 5 hours to obtain an epoxy compound having a weight average molecular weight of about 6,000 to 10,000 Da. Then PGMEA was added thereto to adjust the solid content thereof to 20 wt %.

EXAMPLES AND COMPARATIVE EXAMPLES

Preparation of Photosensitive Resin Compositions

Photosensitive resin compositions of the following Examples and Comparative Examples were prepared using the compounds obtained in the above Synthesis Examples.

Besides, the following compounds were used in the Examples and Comparative

EXAMPLES

Example 1

32.85 parts by weight of a solution of the siloxane polymer (A-1) prepared in Synthesis Example 1, 32.85 parts by weight of a solution of the siloxane polymer (A-2) prepared in Synthesis Example 2, and 34.3 parts by weight of a solution of the siloxane polymer (A-3) prepared in Synthesis Example 3 were mixed. Then, 16.7 parts by weight of TPA-517 (B-1) as a 1,2-quinonediazide-based compound, 0.7 part by weight of BIOC 25 (B-2), 14.3 parts by weight of the epoxy compound (D) prepared in Synthesis Example 4, 6.9 parts by weight of a silane monomer (E), and 0.3 part by weight of a surfactant based on 100 parts by weight of the total siloxane polymers were uniformly mixed. This mixture was dissolved in a mixture of an alcohol and PGMEA (isopropyl alcohol (C-1):PGMEA=15:85 by weight) as a solvent such that the solid content was 22 wt %. The mixture was stirred for 5 hours and filtered through a membrane filter having 0.2 μm pores to obtain a composition solution having a solid content of 22 wt %.

Examples 2 to 4 and Comparative Examples 1 to 5

Composition solutions were prepared in the same manner as in Example 1, except that the components and/or their amounts were changed as described in Table 3 below.

TABLE 2

| | | Component | | Solid content (wt %) | Manufacturer |
|---|---|---|---|---|---|
| 1,2-Quinonediazide-based compound | | B-1 | TPA-517 | 100 | Miwon Commercial |
| | | B-2 | BIOC 25 | 100 | Miwon Commercial |
| | | B-3 | TPA-523 | 100 | Miwon Commercial |
| Solvent | Alcohol | C-1 | Isopropyl alcohol (boiling point: 82.4° C.) | Solvent | Sigma-Aldrich |
| | | C-2 | Propylene glycol monomethyl ether (boiling point: 118° C.) | | Chemtronics |
| | | C-3 | Methanol (boiling point: 64.6° C.) | | Sigma-Aldrich |
| | | C-4 | Ethanol (boiling point: 78.4° C.) | | Fisher |
| | | C-5 | Diacetone ethanol (boiling point: 166° C.) | | Sigma-Aldrich |
| | | C-6 | Dipropylene glycol dimethyl ether (boiling point: 175° C.) | | Hannong Chemicals |
| | Non-Alcohol | C-7 | PGMEA | | Chemtronics |
| Epoxy compound | | D | GHPO3 | 20 | Miwon Commercial |
| Silane compound | | E | Z-6124 Silane (phenyltrimethoxysilane) | 100 | Xiameter |
| Surfactant | | F | Silicon-based leveling surfactant, FZ-2122 | 100 | Dow Corning Tory |

TABLE 3

| Based on 100 parts by weight of siloxane polymers | Siloxane polymer (A) (sum = 100) | | | 1,2-Quinonediazide compound (B) | | | Solvent (C) | C-7 (PGMEA) | Epoxy Comp. (D) | Silane Comp. (E) | Surfactant (F) |
|---|---|---|---|---|---|---|---|---|---|---|---|
| | A-1 | A-2 | A-3 | B-1 | B-2 | B-3 | Alcohol | | | | |
| Ex. 1 | 32.85 | 32.85 | 34.3 | 16.7 | 0.7 | 0 | C-1 15 | 85 | 14.3 | 6.9 | 0.3 |
| Ex. 2 | 32.85 | 32.85 | 34.3 | 16.7 | 0.7 | 0 | C-1 20 | 80 | 14.3 | 6.9 | 0.3 |
| Ex. 3 | 100 | 0 | 0 | 0 | 3.9 | 8.4 | C-2 20 | 80 | 0 | 0 | 0.3 |
| Ex. 4 | 100 | 0 | 0 | 0 | 3.9 | 8.4 | C-2 50 | 50 | 0 | 0 | 0.3 |
| C. Ex. 1 | 32.85 | 32.85 | 34.3 | 16.7 | 0.7 | 0 | — — | 100 | 14.3 | 6.9 | 0.3 |
| C. Ex. 2 | 100 | 0 | 0 | 0 | 3.9 | 8.4 | — — | 100 | 0 | 0 | 0.3 |
| C. Ex. 3 | 32.85 | 32.85 | 34.3 | 16.7 | 0.7 | 0 | C-3 20 | 80 | 14.3 | 6.9 | 0.3 |
| C. Ex. 4 | 100 | 0 | 0 | 0 | 3.9 | 8.4 | C-4 20 | 80 | 0 | 0 | 0.3 |
| C. Ex. 5 | 100 | 0 | 0 | 0 | 3.9 | 8.4 | C-5 20 | 80 | 0 | 0 | 0.3 |
| C. Ex. 6 | 32.85 | 32.85 | 34.3 | 16.7 | 0.7 | 0 | C-6 20 | 80 | 14.3 | 6.9 | 0.3 |

Test Example 1: Evaluation of Sensitivity

The compositions prepared in the Examples and in the Comparative Examples above each were coated on a glass substrate by spin coating. The coated substrate was then pre-baked on a hot plate kept at 110° C. for 90 seconds to form a dried film in a thickness of 3 μm. The dried film was exposed, through a mask having a pattern of square holes in sizes ranging from 1 μm to 30 μm, to light at an exposure rate of 0 to 200 mJ/cm² based on a wavelength of 365 nm for a certain time period using an aligner (model name: MA6), which emits light having a wavelength of 200 nm to 450 nm. It was then developed with an aqueous developer of 2.38 wt % tetramethylammonium hydroxide through puddle nozzles at 23° C. The exposed film thus obtained was then heated in a convection oven at 230° C. for 30 minutes to prepare a cured film.

For the hole pattern formed through a mask having a size of 10 μm, the amount of exposure energy required for attaining a critical dimension (CD, unit: μm) of 10 μm was measured. The lower the exposure energy is, the better the sensitivity of a cured film is. The sensitivity was also converted to a percent unit for the same composition. Here, Comparative Examples 1 and 2 were used as references. The lower the sensitivity % converted is, the better the sensitivity in mJ/cm² is.

Sensitivity (% converted)=sensitivity (mJ/cm²)×100/ reference sensitivity for the same composition (mJ/cm²)

Test Example 2: Evaluation of Film Retention Rate

The compositions prepared in the Examples and in the Comparative Examples above each were coated on a silicon nitride substrate by spin coating. The coated substrate was then pre-baked on a hot plate kept at 110° C. for 90 seconds to form a dried film in a thickness of 3 μm. The dried film was developed with an aqueous developer of 2.38 wt % tetramethylammonium hydroxide through puddle nozzles at 23° C. The developed film was then heated in a convection oven at 230° C. for 30 minutes to prepare a cured film. The film retention rate (%) was yielded by calculating the ratio in percent of the thickness of the finally cured film to that of the film immediately after the pre-bake by using a non-contact type film thickness measurement equipment (SNU Precision). The higher the numerical value is, the better the film retention rate is.

Film retention rate (%)=(thickness of finally cured film/thickness of film after pre-bake)×100

The test results are shown in Table 4 below.

TABLE 4

| | Sensitivity | | Film retention rate (%) |
|---|---|---|---|
| | mJ/cm² (10 μm/10 μm) | % converted (10 μm/10 μm) | |
| Ex. 1 | 28 | 80 relative to Comp. Ex. 1 | 93 |
| Ex. 2 | 17.5 | 50 relative to Comp. Ex. 1 | 92 |
| Ex. 3 | 19.3 | 69 relative to Comp. Ex. 2 | 94 |
| Ex. 4 | 21 | 75 relative to Comp. Ex. 2 | 93 |
| Comp. Ex. 1 | 35 | 100 relative to Comp. Ex. 1 | 92 |
| Comp. Ex. 2 | 28 | 100 relative to Comp. Ex. 2 | 94 |
| Comp. Ex. 3 | 35 | 100 relative to Comp. Ex. 1 | 92 |
| Comp. Ex. 4 | 28 | 100 relative to Comp. Ex. 2 | 94 |
| Comp. Ex. 5 | 21 | 75 relative to Comp. Ex. 2 | 83 |
| Comp. Ex. 6 | 19.3 | 55 relative to Comp. Ex. 1 | 76 |

As shown in Table 4 above, all the cured films formed from the compositions of the Examples, which fall within the scope the present invention, had excellent sensitivity and film retention rate. In contrast, the cured films formed from the compositions according to the Comparative Examples, which do not fall within the scope of the present invention, showed at least one unfavorable property.

The invention claimed is:
1. A photosensitive resin composition comprising:
(A) a siloxane polymer;
(B) a 1,2-quinonediazide-based compound; and
(C) a solvent comprising an alcohol,
wherein the alcohol is at least one selected from the group consisting of isopropyl alcohol, n-propyl alcohol, sec-butyl alcohol, t-butyl alcohol, and allyl alcohol,
wherein the alcohol is comprised in an amount of 5 to 60 wt % based on the total weight of the solvent (C),
and wherein the resin composition is a positive-type photosensitive resin composition.
2. The photosensitive resin composition according to claim 1, wherein the siloxane polymer (A) comprises at least one structural unit derived from a silane compound represented by Formula 1:

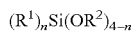

$(R^1)_n Si(OR^2)_{4-n}$      [Formula 1]

wherein R¹ is $C_{1-12}$ alkyl, $C_{2-10}$ alkenyl, or $C_{6-15}$ aryl, wherein, in case that a plurality of R¹ are present in the same molecule, respective R¹s may be the same or different, and in case that R¹ is alkyl, alkenyl, or aryl, its hydrogen atoms may be substituted in part or entirely, and wherein $R^1$ may comprise a structural unit containing a heteroatom;

$R^2$ is hydrogen, $C_{1-6}$ alkyl, $C_{2-6}$ acyl, or $C_{6-15}$ aryl, wherein, in case that a plurality of $R^2$ are present in the same molecule, respective Res may be the same or different, and in case that $R^2$ is alkyl, acyl, or aryl, its hydrogen atoms may be substituted in part or entirely; and n is an integer of 0 to 3.

3. The photosensitive resin composition according to claim 2, wherein the siloxane polymer (A) comprises a structural unit derived from a silane compound represented by Formula 1 where n is 0, in an amount of 10 to 40 mole %, based on an Si atomic mole number.

4. The photosensitive resin composition according to claim 1, which further comprises an epoxy compound.

5. The photosensitive resin composition according to claim 1, which further comprises at least one silane compound represented by Formula 2:

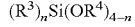   [Formula 2]

wherein $R^3$ is $C_{1-12}$ alkyl, $C_{2-10}$ alkenyl, or $C_{6-15}$ aryl, wherein, in case that a plurality of $R^3$ are present in the same molecule, respective $R^3$s may be the same or different, and in case that $R^3$ is alkyl, alkenyl, or aryl, its hydrogen atoms may be substituted in part or entirely, and wherein $R^3$ may comprise a structural unit containing a heteroatom;

$R^4$ is hydrogen, $C_{1-6}$ alkyl, $C_{2-6}$ acyl, or $C_{6-15}$ aryl, wherein, in case that a plurality of $R^4$ are present in the same molecule, respective $R^4$s may be the same or different, and in case that $R^4$ is alkyl, acyl, or aryl, its hydrogen atoms may be substituted in part or entirely; and n is an integer of 0 to 3.

* * * * *

UNITED STATES PATENT AND TRADEMARK OFFICE
CERTIFICATE OF CORRECTION

PATENT NO. : 10,942,449 B2
APPLICATION NO. : 15/725388
DATED : March 9, 2021
INVENTOR(S) : Kim et al.

Page 1 of 1

It is certified that error appears in the above-identified patent and that said Letters Patent is hereby corrected as shown below:

In the Specification

Column 3, Line 30:
"$R^e s$" should be "$R^2 s$"

In the Claims

In Claim 2, Column 19, Line 7:
"Res" should be "$R^2 s$"

Signed and Sealed this
Eleventh Day of May, 2021

Drew Hirshfeld
*Performing the Functions and Duties of the*
*Under Secretary of Commerce for Intellectual Property and*
*Director of the United States Patent and Trademark Office*